United States Patent
Faes et al.

(10) Patent No.: US 12,218,263 B2
(45) Date of Patent: Feb. 4, 2025

(54) METHOD OF MANUFACTURING A PHOTOVOLTAIC DEVICE

(71) Applicant: CSEM CENTRE SUISSE D'ELECTRONIQUE ET DE MICROTECHNIQUE SA—RECHERCHE ET DEVELOPPEMENT, Neuchâtel (CH)

(72) Inventors: Antonin Faes, Yvonand (CH); Bertrand Paviet-Salomon, Saint-Blaise (CH); Nicolas Badel, La Praz (CH); Jonathan Champliaud, Savagnier (CH); Matthieu Despeisse, Neuchâtel (CH); Christophe Ballif, Neuchâtel (CH); Gaëlle Andreatta, Neuchâtel (CH)

(73) Assignee: CSEM CENTRE SUISSE D'ELECTRONIQUE ET DE MICROTECHNIQUE SA—RECHERCHE ET DEVELOPPEMENT, Neuchâtel (CH)

( * ) Notice: Subject to any disclaimer, the term of this patent is extended or adjusted under 35 U.S.C. 154(b) by 95 days.

(21) Appl. No.: 17/771,972

(22) PCT Filed: Oct. 28, 2020

(86) PCT No.: PCT/EP2020/080255
§ 371 (c)(1),
(2) Date: Apr. 26, 2022

(87) PCT Pub. No.: WO2021/083943
PCT Pub. Date: May 6, 2021

(65) Prior Publication Data
US 2023/0006083 A1    Jan. 5, 2023

(30) Foreign Application Priority Data
Oct. 31, 2019   (EP) .................................. 19206421

(51) Int. Cl.
*H01L 31/044*    (2014.01)
*H01L 31/05*    (2014.01)
*H01L 31/18*    (2006.01)

(52) U.S. Cl.
CPC ...... *H01L 31/0508* (2013.01); *H01L 31/1876* (2013.01)

(58) Field of Classification Search
CPC ..... H01L 31/00–078; H01L 31/18–208; Y02E 10/50–60
USPC .................................................. 136/243–265
See application file for complete search history.

(56) References Cited

U.S. PATENT DOCUMENTS

| | | |
|---|---|---|
| 5,178,685 A | 1/1993 | Borenstein |
| 8,766,090 B2 | 7/2014 | Sewell |
| (Continued) | | |

FOREIGN PATENT DOCUMENTS

| | | |
|---|---|---|
| CN | 107039545 | 8/2017 |
| JP | 2009206366 | 9/2009 |
| (Continued) | | |

OTHER PUBLICATIONS

KR-20150139384-A English (Year: 2015).*
WO-2016203013-A1 English (Year: 2016).*

*Primary Examiner* — Bach T Dinh
(74) *Attorney, Agent, or Firm* — DUANE MORRIS LLP; Gregory M. Lefkowitz; Joaquin Hernandez

(57) ABSTRACT

Method of manufacturing a single-side-contacted photovoltaic device (1), comprising the steps of: a) providing a photovoltaically-active substrate (3) defining a plurality of alternating hole collecting zones (3a) and electron collecting zones (3b) arranged in parallel strips; b) depositing a conductive layer (5) across said zones; c) depositing at least one conductive track (9) extending along at least part of each of said zones (3a, 3b); d) selectively forming a dielectric layer (Continued)

(7) on each of said zones (3*a*, 3*b*), so as to leave an exposed area free of dielectric at an interface between adjacent zones (3*a*, 3*b*); e) etching said conductive layer (5) in said exposed areas; f) applying a plurality of interconnecting conductors (11*a*, 11*b*) so as to electrically interconnect at least a portion of said hole collecting zones (3*a*) with each other, and to electrically interconnect at least a portion of said electron collecting zones (3*b*) with each other.

14 Claims, 7 Drawing Sheets

(56) References Cited

U.S. PATENT DOCUMENTS

| | | |
|---|---|---|
| 2010/0024881 A1 | 2/2010 | Hacke |
| 2011/0120530 A1 | 5/2011 | Isaka |
| 2013/0087192 A1* | 4/2013 | Kim ................ H01L 31/022441 |
| | | 257/E31.124 |
| 2015/0059822 A1* | 3/2015 | Krokoszinski .............................. |
| | | H01L 31/022441 |
| | | 438/98 |
| 2015/0243818 A1 | 8/2015 | Kim |
| 2015/0280021 A1 | 10/2015 | Harley |
| 2015/0280029 A1 | 10/2015 | Harley |
| 2021/0057597 A1* | 2/2021 | Nakano ........... H01L 31/022466 |

FOREIGN PATENT DOCUMENTS

| | | | |
|---|---|---|---|
| KR | 20150139384 A | * 12/2015 | |
| WO | 2011011855 | 2/2011 | |
| WO | 2014124675 | 8/2014 | |
| WO | WO-2016203013 A1 | * 12/2016 | ..... H01L 31/022441 |

* cited by examiner

METHOD OF MANUFACTURING A PHOTOVOLTAIC DEVICE

CROSS-REFERENCE TO RELATED APPLICATIONS

This application is a § 371 national stage entry of International Application No. PCT/EP2020/080255, filed on Oct. 28, 2020, which claims priority to European Patent Application No. 19206421.0, filed on Oct. 31, 2019, the entire contents of which are incorporated herein by reference.

FUNDING STATEMENT

The project leading to this application has received funding from the European Union's Horizon 2020 research and innovation programme under grant agreement No. 727523.

TECHNICAL FIELD

The present invention relates to the field of photovoltaic devices. More particularly, it relates to single-side-contacted solar cells.

STATE OF THE ART

Single-side-contacted solar cells are arranged such that the electrical interconnections between the individual photovoltaic junctions are entirely situated on one face of the cell, typically the back face thereof, since this side is intended to face away from the sun when in use and hence the electrical interconnections do not shade the photovoltaically-active regions of the device. Many back-contact PV cells use copper or silver busbars in electrical connection with electrically-conductive fingers made of screen-printed silver paste arranged to collect current from the hole-collecting and electron-collecting zones of the PV device. These busbars and fingers are printed in several steps over selectively-deposited insulation layers arranged so as to ensure that the busbars are only in contact with the correct fingers, and do not create shunts with the incorrect ones. This requires deposition of significant amounts of material, of which silver is particularly expensive, and is uneconomic for reasons of the material cost, and also results in a relatively long processing time involving a large number of steps.

WO2014/124675 presents a partial solution to this problem by using back-contacted solar cells with busbar-less grid design comprising interrupted fingers interconnected with wires. However, the manufacture of such cells is complex, notably due to the fact that the dielectric layer is provided over the whole surface of the cell and has to be penetrated by the material of the fingers in order to make electrical contact with the underlying photovoltaically active substrate. The choice of SiNx, SiOx or AlyOx for the dielectric layer requires a large number of fabrication steps.

An aim of the present invention is thus to at least partially overcome the above-mentioned disadvantages of the prior art.

DISCLOSURE OF THE INVENTION

This aim is attained by a method of manufacturing a single-side-contacted photovoltaic device, as described in claim 1. This method comprises the steps of:
a) providing a photovoltaically-active substrate comprising one or more layers and defining a plurality of alternating hole collecting zones (such as p-type semiconductor zones) and electron collecting zones (such as n-type semiconductor zones) arranged in adjacent parallel strips considered in the plane of the photovoltaically-active substrate so as to define photovoltaic junctions. This substrate can for instance be a monocrystalline silicon wafer which, depending on the photovoltaic technology being applied, may also comprise one or more further layers formed thereupon so as to define a silicon heterojunction cell which constitutes the substrate. Other PV technologies in which the hole collecting and electron collecting zones are arranged in the same manner are also possible;
b) depositing a conductive layer, such as a layer of transparent conductive oxide (TCO), doped polycrystalline silicon, metal or similar, directly or indirectly on the surface of said zones. This conductive layer typically covers between 90% and 100% of said zones;
c) depositing at least one conductive track extending along at least part of each of said zones, on top of the conductive layer, each zone hence having its own track or tracks situated thereupon;
d) selectively forming a dielectric layer (i.e. an insulating layer) on each of said zones, so as to leave an exposed area free of dielectric at the join between adjacent zones;
e) etching said conductive layer in said exposed areas so as to remove the material of this layer in these areas and hence prevent short circuits between adjacent zones. In this step, the dielectric, which may e.g. be a resist material (e.g. a photoresist, a thermally-curable polymer or similar), a self-assembled monolayer or other etch-resistant substance, acts as an etching mask so as to selectively etch the conductive layer and thereby to leave the underlying substrate exposed;
f) applying a plurality of interconnecting conductors so as to electrically interconnect at least a portion of said hole collecting zones with each other, and to electrically interconnect at least a portion of said electron collecting zones with each other.

This method is particularly simple, and uses the dielectric layer in two roles, i.e. as an etch mask for etching the conductive layer, and also as part of the structure of the photovoltaic device. This reduces the number of processing steps to a minimum.

Advantageously, each of said zones has a plurality of conductive tracks separated by gaps provided thereupon, with the gaps of each zone facing a track of the adjacent zone(s). Considered another way, each zone has an interrupted track upon it. This arrangement enables simple application of the interconnecting conductors without any risk that one makes an electrical contact with a track situated on the wrong zone, thereby causing a shunt. In essence, the interconnecting conductors for the hole collecting zones pass between the tracks of the electron collecting zones and vice versa.

Alternatively, each of said tracks can be continuous and in step d) the dielectric layer is formed with greater thickness or width so as to expose the tracks at locations where electrical connections between said tracks and said interconnecting conductors are not desired, and lesser thickness or width where electrical connections between said tracks and said interconnecting conductors are desired.

Alternatively, each of said tracks can be shaped as a hollow lozenge, each zone having one or more such lozenge-shaped tracks situated thereupon. Since such forms of track have two potential contact points with the interconnects, this reduces the chance of not making a connection when the interconnects are applied. In such a case, it is also possible for each of said lozenge-shaped tracks to be filled with a solder material such as InSn, BiSnAg or similar subsequent to step c) but before step f).

Advantageously, said dielectric material is an organic material such as a thermoset resist, a photoresist, a polymer or a self-assembled monolayer.

In all cases, said at least one conductive track may be fully embedded in said selectively-formed dielectric layer, particularly in the case with uninterrupted tracks, or may protrude therefrom.

Advantageously, subsequent to step e) but before step f), an optional insulating layer may be provided upon the areas of the substrate exposed by etching in step e), so as to eliminate all risk of electrical shunts caused by the conductors. Such a layer of insulator, which is distinct from the dielectric layer described above, guarantees that the interconnecting conductors cannot touch the substrate and thereby make undesired electrical contact therewith.

Advantageously, step d) comprises at least one of:
deposition of said dielectric layer with subsequent selective removal thereof, e.g. by photolithography, laser ablation or similar;
selective deposition of said dielectric layer;
selective deposition of lines of dielectric so as to delimit the boundaries of the dielectric layer, followed by selective deposition of said dielectric layer between said lines of said dielectric.

Advantageously, said tracks and/or said interconnecting conductors are provided with a layer of solder material thereupon, such as InSn, BiSnAg or similar. This improves the connection between the tracks and the interconnects.

Advantageously, step f) comprises an application of heat and pressure to the electrical interconnectors so as to embed them at least partially into said dielectric material. In the case in which the dielectric is a photoresist material, this softens and/or melts the material, bonding the interconnects to the tracks. Furthermore, if either or both of the interconnects and the tracks has a layer of solder material such as InSn, BiSnAg or similar provided thereupon, this can be melted in order to further improve the electrical connection.

Advantageously, said selectively-formed dielectric remains in the finished photovoltaic device, keeping the number of processing steps down to a minimum. In the case in which the dielectric is itself transparent, the resulting photovoltaic device can be used in a bifacial PV module, so as to also be able to harvest reflected light impinging on its back side.

The invention furthermore relates to a single-side-contacted photovoltaic device comprising:
a photovoltaically-active substrate, such as a monocrystalline silicon wafer, defining a plurality of alternating hole collecting zones (such as p-type semiconductor zones) and electron collecting zones (such as n-type semiconductor zones) arranged in parallel strips considered in the plane of the layer;
a conductive layer such as a layer of transparent conductive oxide (TCO), doped microcrystalline silicon, metal or similar, situated directly or indirectly upon said zones and patterned such that the junctions between adjacent zones are free of transparent conductive oxide so as to prevent short circuits between zones of different types;
at least one conductive track extending along at least part of each of said zones;
a dielectric (i.e. insulating) layer situated on said conductive layer;
a plurality of interconnecting conductors arranged so as to electrically interconnect at least a portion of said hole collecting zones with each other, and to electrically interconnect at least a portion of said electron collecting zones with each other.

This device is simple, and can be manufactured in a minimum number of steps by the method described above.

Advantageously, said dielectric material is an organic material such as a photoresist or a self-assembled monolayer.

Advantageously, an insulating layer may be situated upon at least part of the substrate exposed by etching, i.e. at the interfaces between the zones, to eliminate all risk of the interconnecting conductors making undesired electrical contact with the substrate.

BRIEF DESCRIPTION OF THE DRAWINGS

Further details of the invention will appear more clearly upon reading the following description in reference with the annexed figures, which illustrate.

EMBODIMENTS OF THE INVENTION

Figure 1:
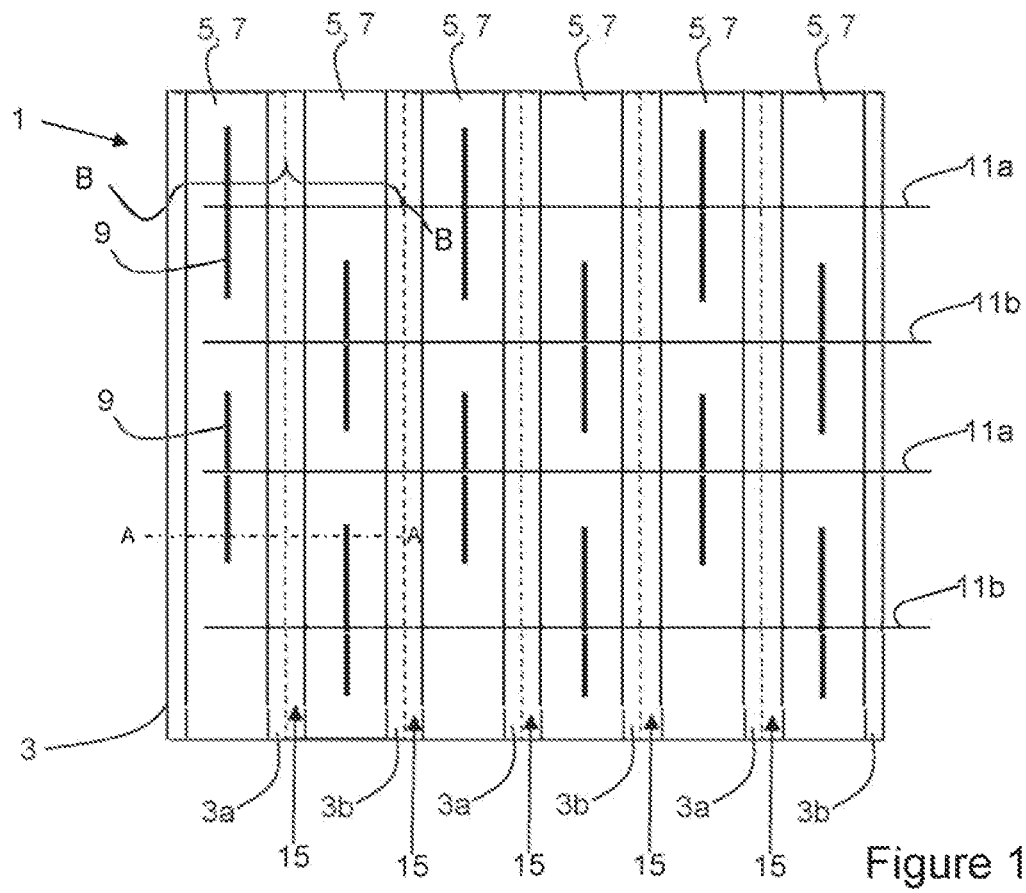
FIG. 1: a schematic plan view of a photovoltaic device according to a first embodiment of the invention.
Figure 2:
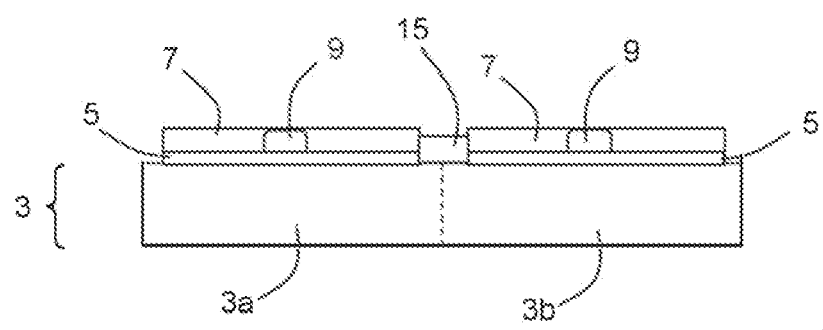
FIG. 2: a schematic partial sectional view along line A-A of FIG. 1.
Figure 3:
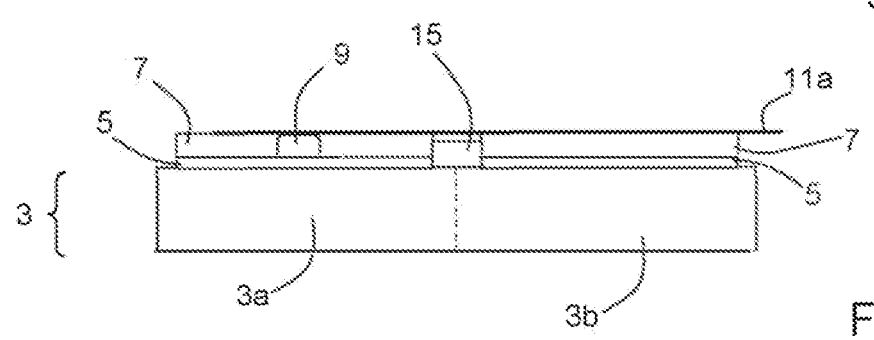
FIG. 3: a schematic partial sectional view along line B-B of FIG. 1.

FIGS. 1-3 illustrate a first variant of a photovoltaic device 1 according to the invention, FIG. 1 being a plan view of the cell 1, FIG. 2 being a partial cross-section along line A-A, and FIG. 3 being a partial cross section along line B-B.

The cell 1 comprises at least one photovoltaically-active substrate 3, which comprises alternating bands of hole collecting zones 3a (such as p-type semiconductor zones) and electron collecting zones 3b (such as n-type semiconductor zones) which constitute photovoltaic junctions and, when exposed to light, respectively collect holes and electrons, thereby generating a voltage between each type of zone 3a, 3b. The zones 3a, 3b extend parallel to each other in the plane of the layer 3, as is generally known, and the interface between each pair of adjacent zones 3a, 3b is illustrated with a dashed line.

Any suitable photovoltaic technology can be used for the photovoltaically-active substrate 3, such as silicon heterojunction technology based on a crystalline silicon wafer in which the zones 3a, 3b are defined by deposition of appropriately-doped thin layers or layer stacks deposited on the wafer, or silicon homojunction technology in which the zones 3a, 3b are formed by incorporation of appropriate dopants into a monocrystalline silicon wafer. It should be noted that, in the sense of the present invention, the substrate 3 should not be construed as necessarily being monolithic, and may be an assembly of layers (wafer, doped layers, tunnelling layers, passivation layers and so on), such as in the aforementioned heterojunction technology. Furthermore, any other suitable PV technology in which the zones 3a, 3b are formed as adjacent bands are also possible.

A first face of the photovoltaically-active substrate 3 (the upper face in FIGS. 2 and 3) is used for contacting. This is typically the back face of the cell 1, intended to face away from the primary direction of incident light (i.e. away from the sky when installed outside), but it is not excluded that this face could be the front, i.e. light-incident, side of the cell.

Upon each zone 3a, 3b is provided a conductive layer 5, such as a layer of of transparent conductive oxide (TCO), doped polycrystalline silicon, metal or similar (e.g. with an electrical conductivity of at least $1.0 \times 10^4$ S/m), arranged such that a gap is present between the conductive layer 5 provided on each adjacent zone 3a, 3b, so as to avoid short-circuit shunts between zones of different type. A typical separation between adjacent conductive layers 5 is between 1 μm and 1000 μm, preferably between 50 μm and 400 μm. In the case of TCO being used for the conductive layer 5, typical materials are indium-doped tin oxide, indium-doped zinc oxide, aluminium-doped zinc oxide, boron-doped zinc oxide or similar. The areas free of conductive layer 5 are typically centred on the interface between the zones 3a, 3b, although can be arranged asymmetrically with respect thereto.

Upon each conductive layer 5 is a patterned dielectric (i.e. insulating) layer 7 (e.g. having a conductivity of less than $1.0 \times 10^{-3}$ S/m) in which at least one electrically-conductive track 9 is at least partially embedded, extending along at least part of each zone 3a, 3b. As illustrated, these tracks 9 are interrupted such that a mid-point of each track 9 in any given zone 3a, 3b faces a midpoint of the gap between tracks 9 in the adjacent zone 3b, 3a. The tracks 9 may be fully embedded in the dielectric layer 7, or may protrude therefrom. The tracks typically have a width between 1 μm and 300 μm, preferably between 20 μm and 100 μm, and a thickness of between 1 μm and 50 μm, preferably between 3 μm and 20 μm. Although the sections of track 9 have been illustrated with single lines, each zone 3a, 3b may comprise a plurality of parallel tracks, the number of which can vary depending on the sheet resistance of the conductive layer 5 and of the underlying substrate 3, and can comprise between 1 and 10, preferably between 1 and 4 parallel tracks.

The electrically-conductive tracks 9 may be e.g. formed from silver paste, copper plating, gold plating, conductive ink or any other convenient electrically-conducting material as is generally known. Silver paste is the best option amongst these and can be printed on the conductive layer 5 e.g. by screen printing, but the others are not to be construed as being excluded. In the case in which the tracks 9 are fully embedded in the dielectric layer 7, materials which are not stable to the etchant in question can be used safely, since they are protected therefrom by the dielectric 7.

The dielectric layer 7 in question is typically an organic substance and can, for instance, be a photoresist, a self-assembled monolayer or any other convenient selectively-removable or selectively-depositable layer, for reasons that will become apparent in the discussion of the method of the invention below. In the case of a resist material, typical thickness is between 0.05 μm and 40 μm, further preferably between 1 μm and 15 μm. Such a resist typically is an organic layer formed of a compound having a carbon chain at least three carbons long, which may be hardened by heat, UV light or similar. In the case in which the tracks 9 are fully embedded in a resist material 7, the thickness of this latter over the top of the tracks should be between 0.05 μm and 40 μm. The layer 7 may be a photoresist patterned by well-known lithographic techniques, a thermoset resist that is deposited by screen printing or CNC-controlled printing, a hotmelt polymer deposited by CNC-controlled printing, may be deposited via a vacuum process such as physical vapour deposition or chemical vapour deposition (depending on the material), or similar. Furthermore, dielectric material 7 is ideally transparent to visible and infrared light, which is particularly advantageous in bifacial applications.

A plurality of interconnecting conductors, i.e. interconnectors, 11a, 11b, extending substantially perpendicular to the tracks 9, interconnect each set of zones 3a, 3b respectively, and transport current. To this end, the interconnectors 11a, 11b are in electrical contact with the corresponding tracks 9, for instance by being soldered thereto with low-temperature solder, or simply by being glued thereto by the dielectric 7 in the case in which it is a resin such as a resist material. A particularly suitable technology for the interconnects are copper wires coated with a thin low melting point alloy layer supported by a polymer foil, as described in the publication "SMARTWIRE SOLAR CELL INTERCONNECTION TECHNOLOGY", Faes et al, Proc. $29^{th}$ Eur. Photovoltaic Sol. Energy Conf., January 2014. However, conventional wires or ribbons connected to the tracks 9 by solder, conductive ink, silver paste, conductive organic coating (like PEDOT-PSS for example), mechanical contacts or similar are also possible.

An optional insulating layer 15 (e.g. having a conductivity of less than $1.0 \times 10^{-3}$ S/m) may be provided at least in the gaps between each stack of conductive layer 5 and dielectric layer 7, i.e. at the interfaces between the zones 3a, 3b. This insulating layer 15 hence covers the areas of the substrate 3 not covered by dielectric layer 7 and eliminates the risk that the interconnecting conductors 11a, 11b may come into electrical contact with the surface of the substrate 3 and cause electrical shunts. The insulating layer 15, which is distinct from the dielectric layer 7 and is deposited in a separate (optional) step (see below), may extend to the same height above the substrate 5 as the dielectric layer 7, or may have a thickness such that its upper surface is situated above or below that of the dielectric layer 7. In terms of materials for the insulating layer 15, this may be of the same material or a different material as the dielectric layer 7 (see the materials listed in respect of this latter, which are also suited for the insulating layer 15), and may likewise be formed by the processes listed in respect of this latter.

Alternatively, the insulating layer 5 may be deposited over the entire surface of the cell.

The complete cell 1 is furthermore encapsulated (not illustrated), as is generally known, for instance by being laminated into a sandwich structure with a suitable transparent polymer encapsulant, suitable front sheet and suitable back sheet.

Figure 4A:
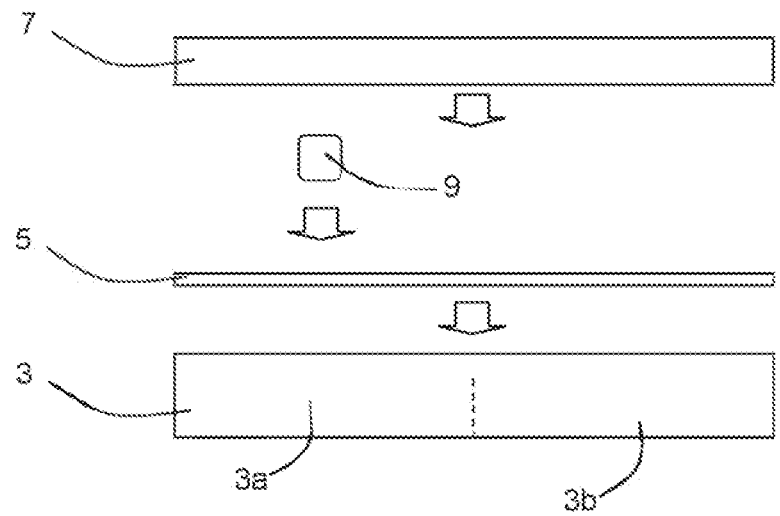
FIGS. 4a-4d: schematic partial sectional views of a method according to the invention, along line B-B of FIG. 1.
Figure 4B:
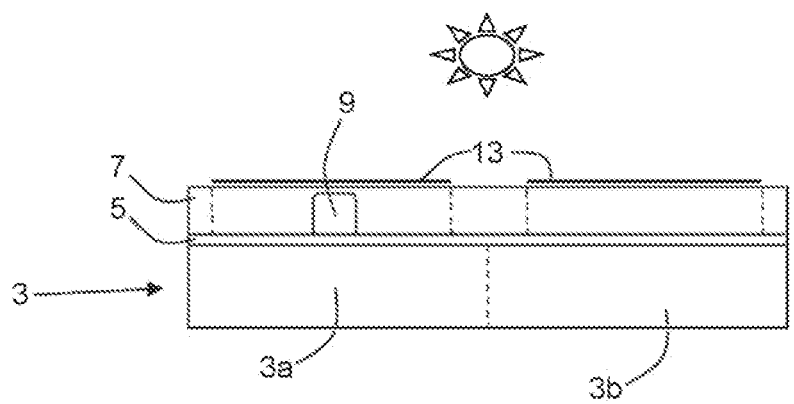
Figure 4C:
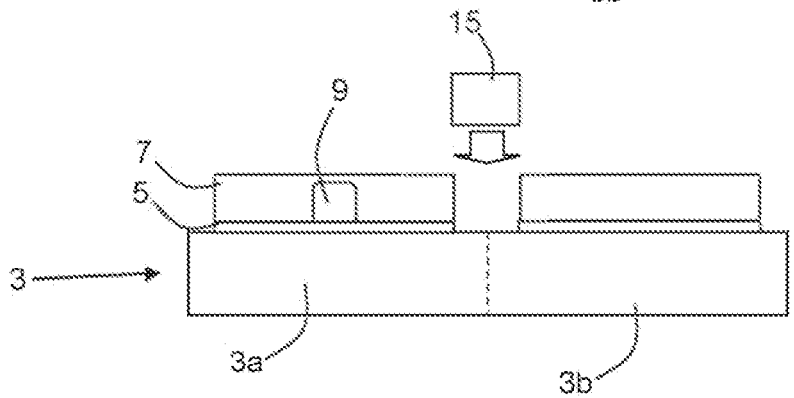

FIGS. 4a-4c represent schematically a method according to the invention, for manufacturing the cell 1 of FIGS. 1-3, in cross section along the line B-B.

As illustrated in FIG. 4a, the photoactive layer 3 is first provided, as discussed previously. As illustrated, this is a monocrystalline silicon heterojunction wafer, with the hole collecting zones 3a and electron collecting zones 3b already created, and any other layers already provided thereupon.

Subsequently, conductive layer 5 is deposited directly or indirectly over the whole of the surface of the photoactive layer 3, and the electrically-conductive tracks 9 (of which only one is illustrated here) are formed thereon. In the case in which the tracks 9 are made from silver paste, this can simply be printed, for instance by means of screen printing, CNC-controlled printing, or other convenient type of printing. In the case of copper, this can be deposited over the whole surface and selectively etched as is generally known.

A dielectric layer is then provided on the surface of the conductive layer 5 and on the tracks 9, which may be fully embedded therein (as illustrated) or may protrude from the free surface thereof, which permits easy electrical testing of the cell 1 prior to applying the interconnects 11a, 11b. This dielectric is an organic compound, and can e.g. be a photoresist, a self-assembled monolayer, or similar. In the case of a self-assembled monolayer, this can be e.g. 12,12,13,13,14,14,15,15,15,15-Nonafluoropentadecylphosphonic acid, 12,12,13,13,14,14,15,15,16,16,17,17-Tridecafluoroseptadecylphosphonic acid, 12,12,13,13,14,14,15,15,16,16,17,17,18,18,19,19,19-Heptadecafluorononadecylphosphonic acid, 10-((3,3,4,4,5,5,6,6,7,7,8,8,9,9,10,10,10-Heptadecafluorodecyloxy)carbonyl)decylphosphonic acid, 5,7,7-Trimethyl-2-(4,4-dimethylpentan-2-yl)octylphosphonic acid, Diethyl-12-pentafluorophenoxydodecylphosphonate, octadecylphosphonic acid, decylphosphonic acid, dodecylphosphonic acid, octylphosphonic acid, 10,11-Bis(2,2,3,3,4,4,5,5,6,6,7,7,8,8,9,9,9-Heptadecafluorononyl) icosane-1,20-diyldiphosphonic acid or any other convenient SAM. Since SAM layers are very thin, the tracks 9 will protrude therefrom.

In the variant illustrated, in FIG. 4b the dielectric layer 7 is patterned by the well-known selective UV exposure lithographic process through a mask 13, by laser ablation or similar. In the case of a photoresist, this can be a positive or a negative resist, either the exposed or unexposed portions of the layer being subsequently removed with solvent depending on the type of resist used. Alternatively, in a non-illustrated embodiment, the dielectric layer 7 may be deposited in a patterned fashion e.g. by printing, hence avoiding the steps of selective removal. As a result, the areas immediately adjacent to the joins between the zones 3a, 3b are devoid of dielectric 7 and are hence exposed to attack from an etching agent.

The patterned dielectric layer 7 is then used as a mask for etching the underlying conductive layer 5, so as to create discrete contacts with the underlying zones 3a, 3b, without shunts between them, as illustrated in FIG. 4c. This etching can be carried out e.g. by means of a dilute acid, after which the workpiece is rinsed. If insulating layer 15 is present, it is subsequently deposited e.g. by screen printing, CNC-controlled printing or similar, as schematically indicated by the arrow. If deposited over the whole surface rather than selectively in the gaps between areas of dielectric layer 7, other deposition processes such as vacuum processes (i.e. PVD, CVD in function of the material) are possible.

Figure 4D:
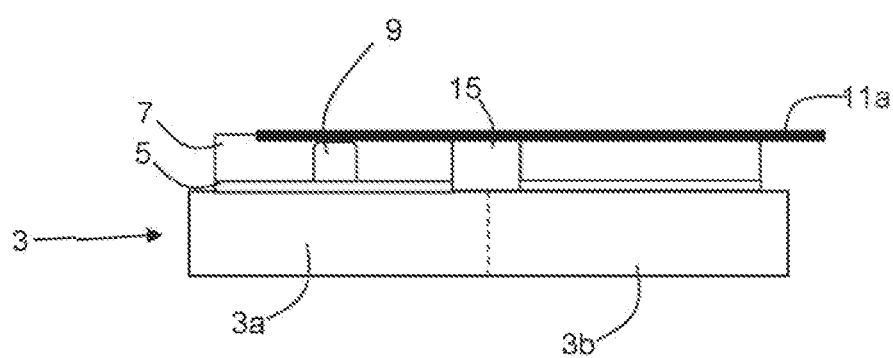

Subsequently, as illustrated in FIG. 4d, the interconnects 11a, 11b are applied either as wires or ribbons supported by a machine, or as a "smartwire"-type assembly as discussed above. During this step, heat and pressure may be applied, which will cause the interconnects 11a to bond to the corresponding tracks 9. If the interconnects 11a, 11b are coated in a low-temperature solder material as described in the referenced publication (herein incorporated by reference in its entirety), this melts and solders the tracks 9 and interconnects 11a, 11b together at the points of contact. Likewise, if the tracks 9 are made of e.g. copper and are coated in low-temperature solder material, this will melt and solder the tracks 9 to the interconnects 11a, 11b at the required points.

Furthermore, whether the interconnects 11a, 11b and/or the tracks 9 are coated with low-temperature solder or not, if the tracks 9 are fully embedded in the dielectric material 7, the application of heat at a sufficient temperature will soften and/or melt this latter if it is a resist material, and as a result contact with the tracks 9 will be established. Upon cooling, the resist material will bond the interconnects 11a, 11b in position in contact with the tracks as required.

Typical processing conditions for this step involve lamination at between 70° C. and 250° C., preferably between 90° C. and 170° C. under partial vacuum with a loading pressure between 0.1 bar and 1 bar preferably 0.6 bar and 1 bar, the temperature being chosen as appropriate in function of the properties of the dielectric 7 and any solder material present on the interconnects 11a, 11b and/or tracks 9.

Typical properties of a suitable photoresist material as dielectric 7 are given in the following table:

| Physical properties | Working material (EMS 535-11M-7) | Lower limit | Upper limit |
| --- | --- | --- | --- |
| Shore hardness A (ASTM D2240) | 60 | 0.5 | 300 |
| Lap shear strength (aluminum substrate) (ASMT D-1002) | >3.45 MPa | 0.5 | 150 |
| Operating temperature range | −40 to +160° C. | −100° C. | +250° C. |
| Storage Modulus (@ 25° C.) (DMA) | 5.6 GPa | 0.1 GPa | 100 GPa |
| Storage Modulus (@ 100° C.) (DMA) | (EMS NR-1500) 3.5 GPa | 0.1 GPa | 100 GPa |
| Storage Modulus (@ 150° C.) (DMA) | (EMS NR-1500) 2.5 GPa | 0.1 GPa | 100 GPa |
| Storage Modulus (@ 200° C.) (DMA) | (EMS DF-1020) 0.2 GPa | 0.1 GPa | 100 GPa |
| Glass Transition Temperature (DSC ½ weight) | −3.5° C. | −150° C. | 250° C. |

-continued

| Physical properties | Working material (EMS 535-11M-7) | Lower limit | Upper limit |
|---|---|---|---|
| Glass Transition Temperature (DMA tan Delta) | 16° C. | −150° C. | 250° C. |

Figure 5:
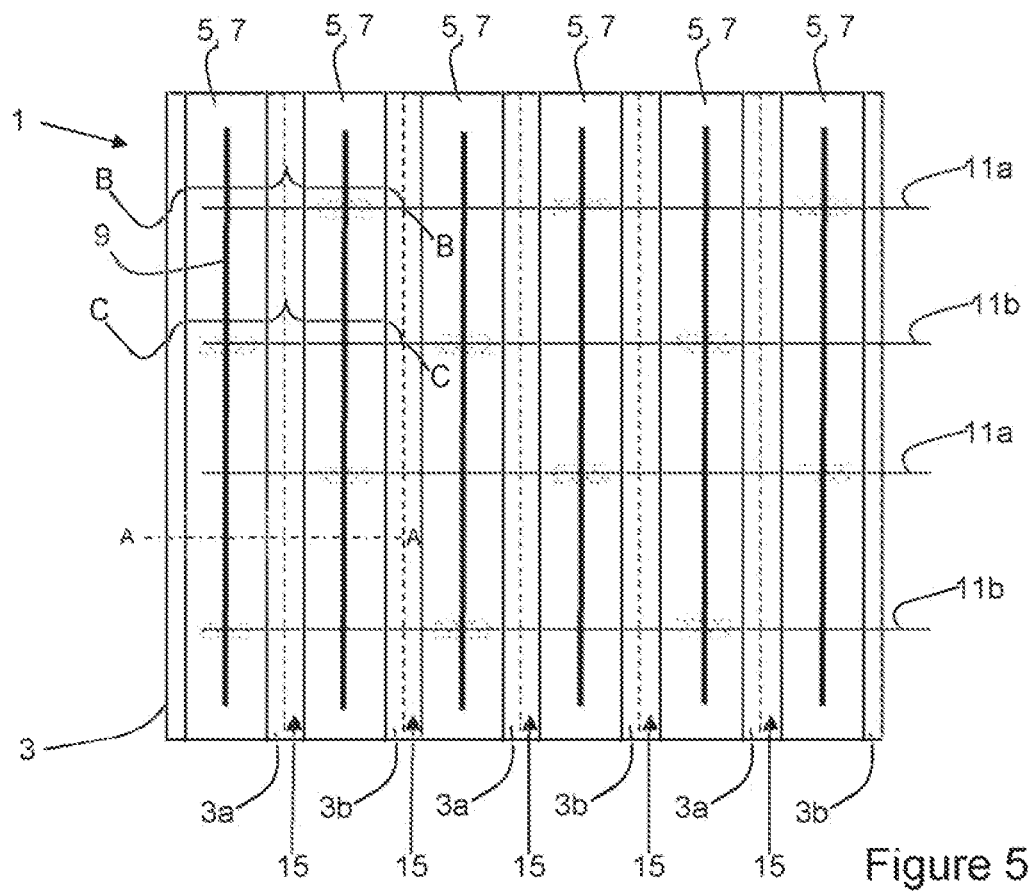
FIG. 5: a schematic plan view of a photovoltaic device according to a further embodiment of the invention.
Figure 6:
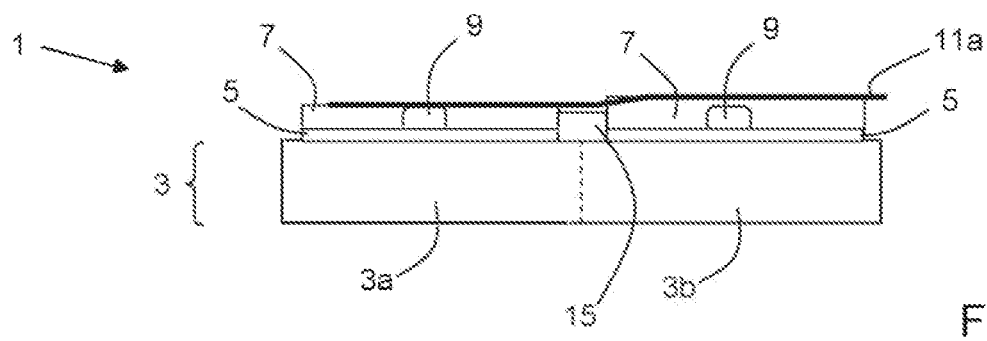
FIG. 6: a schematic partial sectional view along line B-B of FIG. 5.

FIGS. 5 and 6 illustrate, in similar views to FIGS. 1 and 3, a further variant of a photovoltaic device 1 according to the invention. In this variant, the tracks 9 are unbroken and extend parallel to each other for their full respective lengths.

In order to prevent shunts, the dielectric layer 7 is thicker in zones (illustrated with dots) where a connection between the interconnects 11a, 11b and the tracks 9 are not to take place. In the illustrated example of FIG. 6, which represents a section along B-B of FIG. 5, the zone of the dielectric layer 7 (which is a resist layer in this example) over the zone 3a is thinner than that over the zone 3b. As a result, when the interconnects 11a, 11b are applied and heated, contact will only be made to the track 9 over the zone 3a, and no contact will be made with the track 9 over the zone 3b and a quantity of resist will remain, and the interconnect 11b is insulated from the underlying track 9 and shunts are prevented. The exact heat, pressure and time for applying the interconnects 11a, 11b can be determined by routine experimentation so as to ensure electrical connection where desired and to avoid it where undesired.

Although not illustrated, it is clear that, considering a section along the line C-C of FIG. 5, the dielectric layer 7 over the zone 3a will be thicker than that over the zone 3b such that contact is made between the interconnect 11b contacts the correct track 9 over the zone 3b.

In terms of deposition of the dielectric layer 7, since its thickness varies depending on where connections are to take place, this can either be deposited in two steps in order to create two superposed layers thereof, or after formation of the resist layer as in FIG. 4, extra photoresist material can for instance be deposited by CNC-controlled printing, screen printing or similar to create thicker zones where contact is not to take place, either before or after patterning of the dielectric 7. It is furthermore possible to use two different dielectric materials so as to create the bulk of the dielectric layer 7 and the thicker portions thereof.

Figure 7:
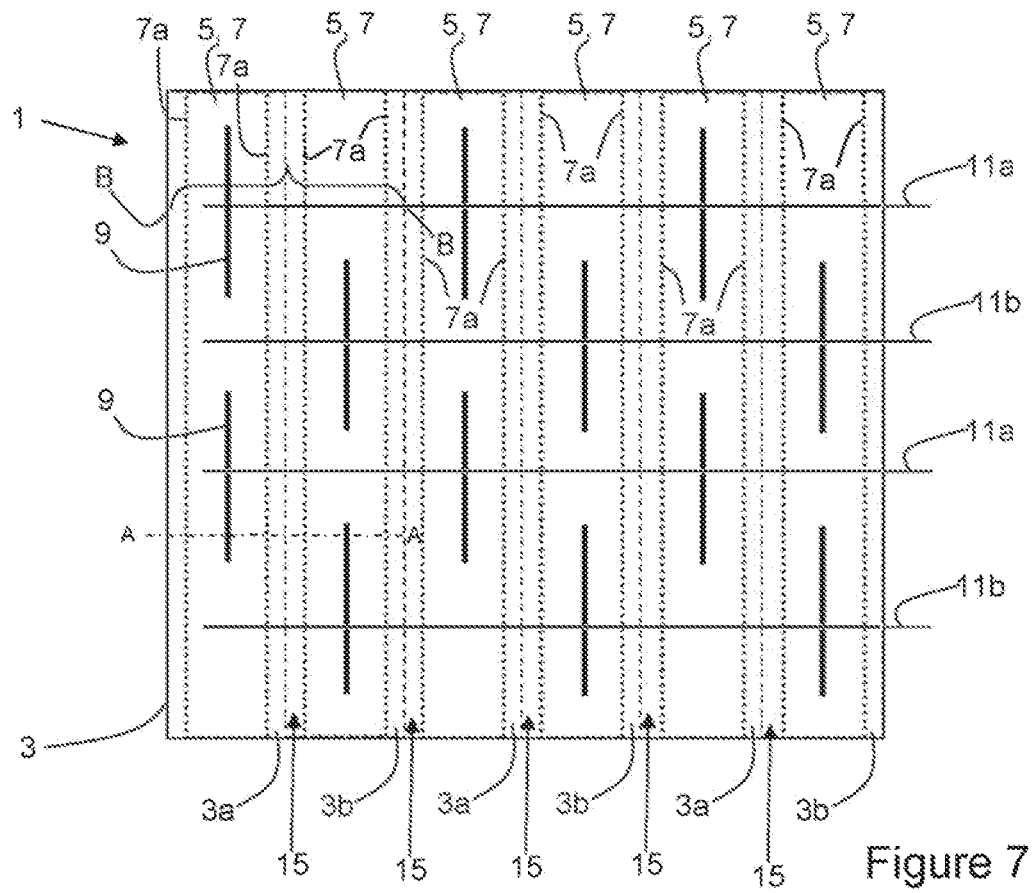
FIG. 7: a schematic plan view of a photovoltaic device according to a further embodiment of the invention.
Figure 8:
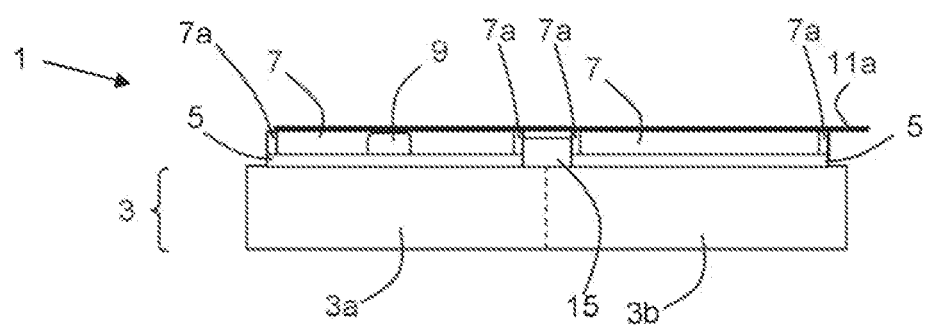
FIG. 8: a schematic partial sectional view along line B-B of FIG. 7.

FIGS. 7 and 8 illustrate a further variant of a photoelectric device 1 according to the invention. This variant differs from that of FIGS. 1-3 in that the bulk of the dielectric layer 7, which is again a resist layer, is deposited in two stages. The first of these stages is a selective deposition of relatively fine lines of resist 7a (illustrated in FIG. 7 by dotted lines), which are deposited by CNC-controlled printing, screen printing or similar so as to delimit the overall extent of the dielectric layer. Such fine lines can be relatively precisely printed by screen printing or CNC-controlled printing, and after hardening form dam walls between which the remainder of the dielectric layer 7 is printed e.g. by screen printing. These fine lines of dielectric 7a form barriers to ensure that the boundaries of the dielectric are precisely defined, prevent bleeding of the dielectric from one zone 3a to another 3b causing a shunt due to unetched portions of the conductive layer 5 which should have been removed. It should be noted that the fine lines 7a of dielectric may be of the same material as the remainder of the dielectric layer 7 or may be a different material.

This same principle can also be applied to the embodiment of FIGS. 5 and 6.

Figure 9:
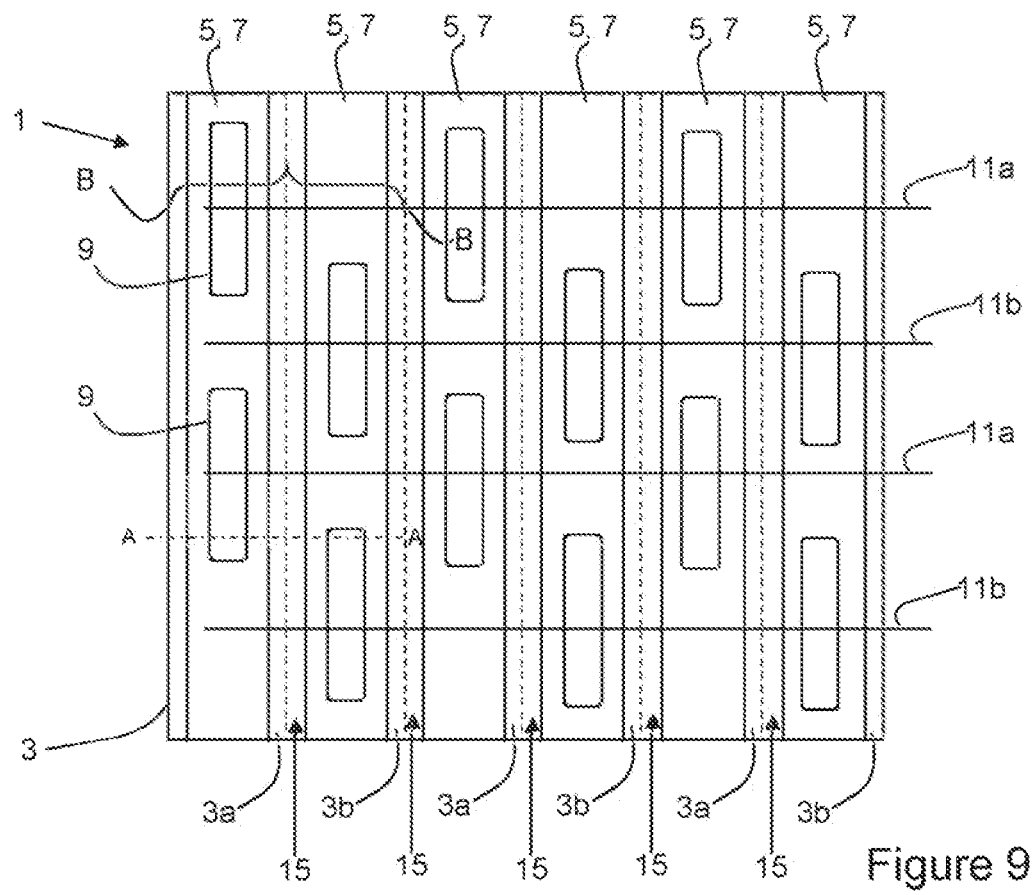
FIG. 9: a schematic plan view of a photovoltaic device according to a further embodiment of the invention.
Figure 10:
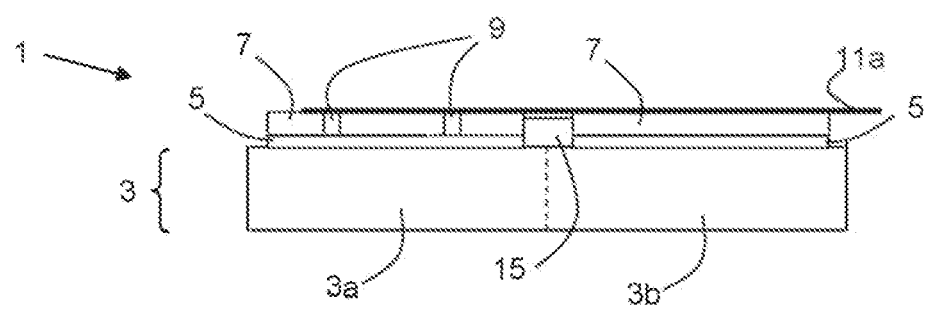
FIG. 10: a schematic partial sectional view along line B-B of FIG. 9.

FIGS. 9 and 10 illustrate a yet further variant of a photoelectric device 1 according to the invention, which differs from that of FIG. 1 in that each individual track 9 is formed as a closed, hollow, elongated lozenge with its major axis aligned with the major axis of the zones 3a, 3b. This arrangement presents two connection points between each track 9, reducing the chance of a track 9 not connecting with its corresponding interconnect 11a, 11b. It is also possible that each of the lozenge-shaped tracks 9 can be joined to the neighbouring one with a relatively thing joining track, the thicker zones of dielectric 7 of the embodiment of FIGS. 5 and 6 being used to prevent undesired connections with these joining tracks. Furthermore, in a non-illustrated variant, the hollow interior of the tracks 9 can be filled with a low-temperature solder alloy such as InSn, BiSnAg or similar, in order to provide a greater area of conductor while keeping the amount of silver used to a minimum.

Figure 11:
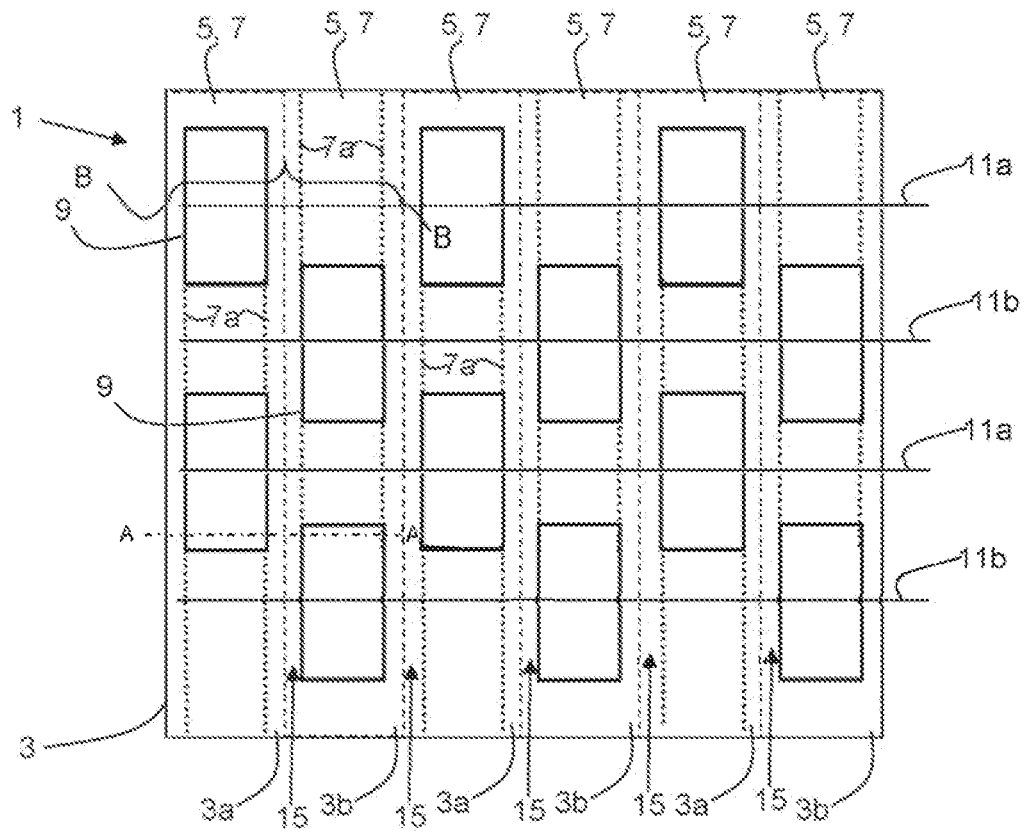
FIG. 11: a schematic plan view of a photovoltaic device according to a further embodiment of the invention.
Figure 12:
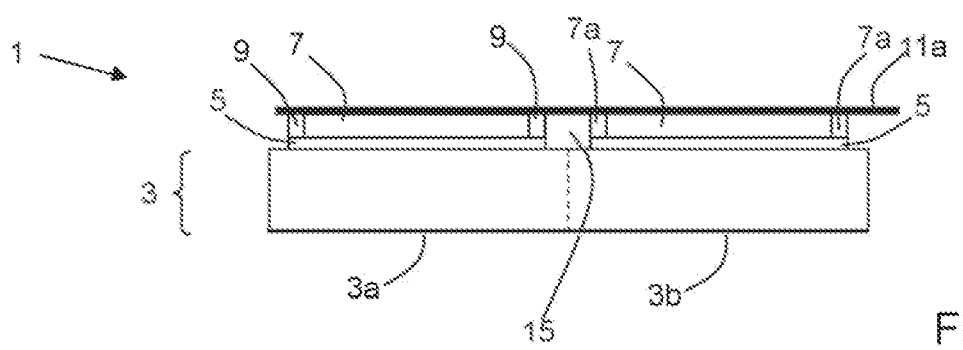
FIG. 12: a schematic partial sectional view along line B-B of FIG. 10.

FIGS. 11 and 12 illustrate a further variant of a photovoltaic device 1 according to the invention. In this variant, the tracks 9 are again lozenge shaped, with a several lozenges arranged in a line extending along each zone 3a, 3b proximate to the edges of the corresponding zone 3a, 3b, and alternating from one zone to the next as in the manner of FIG. 1.

The tracks 9 are arranged in such a manner as to act as dam walls to prevent overspill of dielectric 7 selectively deposited inside the tracks 9 e.g. by screen printing, CNC-controlled printing or similar. Alternatively, a low temperature solder material can be provided within each of the lozenge-shaped tracks 9 as described above in the context of FIGS. 9 and 10.

Furthermore, relatively fine lines of dielectric 7a similar to those of FIGS. 7 and 8 (illustrated again by means of dotted lines), acting as insulating dam walls, extend between each of the lozenge-shaped tracks 9, in the prolongation of their sides running parallel to the zones 3a, 3b. Hence, when the dielectric 7 is applied within the dam walls formed by the tracks 9 and the relatively fine lines of dielectric 7a, it cannot spread across the interface between the zones 3a, 3b and cause a shunt.

It should be noted that the sections of the tracks 9 extending perpendicular to the zones 3a, 3b can be omitted, the tracks 9 hence being formed of pairs of parallel conductors.

Of course, further, different forms of the tracks 9 are also possible.

In view of the foregoing, it can be seen that manufacture of all the variants of the photovoltaic device 1 of the invention is relatively simple, and can be carried out with a minimum of steps and with a minimum of material cost. In the case in which the dielectric 7 is a thermoset resist, a photoresist or a self-assembled monolayer, it does not have to be removed and can remain in the device.

The absence of busbars makes the photovoltaic devices 1 according to the invention particularly suitable for bifacial applications, in which light arriving on the rear side of the device 1 is also converted into electricity. Typically, busbars or large areas of conductors on the rear side of the device 1 (i.e. the side intended to face away from the sky) block a significant proportion of light incident on the rear side, reducing efficiency. The relatively small area of conductors in the devices of the present invention blocks less rear-side incident light, and hence improves efficiency. In such an application, the dielectric 7 (and the relatively fine lines of dielectric 7a, if present) is preferably substantially transparent to the wavelengths of interest that can be photoconverted by the device 1, in order to avoid shading by the dielectric 7.

Although the invention has been described in connection with specific embodiments, variations thereto are possible without departing from the scope of the invention as defined in the appended claims.

We claim:

1. Method of manufacturing a single-side-contacted photovoltaic device, comprising the steps of:
   a) providing a photovoltaically-active substrate defining a plurality of alternating hole collecting zones and electron collecting zones arranged in parallel strips;
   b) depositing a conductive layer across said zones;
   c) depositing at least one conductive track extending along at least part of each of said zones;
   d) subsequently to step c), selectively forming a dielectric layer on each of said zones, so as to leave an exposed area free of dielectric at an interface between adjacent zones, in which said selectively-formed dielectric layer remains in the finished photovoltaic device;
   e) etching said conductive layer in said exposed areas;
   f) applying a plurality of interconnecting conductors so as to electrically interconnect at least a portion of said hole collecting zones with each other, and to electrically interconnect at least a portion of said electron collecting zones with each other.

2. The method according to claim 1, wherein each of said zones has a plurality of conductive tracks, separated by gaps, formed thereupon, the gaps of each zone facing a track of the adjacent zone.

3. The method according to claim 1, wherein each of said tracks is continuous and wherein in step d) the dielectric layer is formed with greater thickness or width where electrical connections between said tracks and said interconnecting conductors are not desired, and lesser thickness or width where electrical connections between said tracks and said interconnecting conductors are desired.

4. The method according to claim 1, wherein each of said tracks is shaped as a hollow lozenge.

5. The method according to claim 4, wherein each zone comprises a plurality of such lozenge-shaped tracks situated thereupon.

6. The Method according to claim 4, wherein each of said lozenge-shaped tracks is filled with a solder material subsequent to step c) but before step f).

7. The Method according to claim 1, wherein said dielectric material is an organic material such as a photoresist or a self-assembled monolayer.

8. The Method according to claim 7, wherein said at least one conductive track is fully embedded in said selectively-formed dielectric layer or protrudes therefrom.

9. The Method according to claim 1, comprising, subsequent to step e) and before step f), a step of applying an insulating layer upon at least a part of said photovoltaically-active substrate 3 in areas etched in step e).

10. The Method according to claim 1, wherein step d) comprises at least one of:
    deposition of said dielectric layer with subsequent selective removal thereof;
    selective deposition of said dielectric layer;
    selective deposition of lines of dielectric so as to delimit the boundaries of the dielectric layer, followed by selective deposition of said dielectric layer between said lines of said dielectric.

11. The Method according to claim 1, wherein at least one of said tracks and said interconnecting conductors are provided with a layer of solder material thereupon.

12. The Method according to claim 1, wherein step f) comprises an application of heat and pressure to the electrical interconnectors so as to embed them at least partially into said dielectric material.

13. Method of manufacturing a single-side-contacted photovoltaic device, comprising the steps of:
    a) providing a photovoltaically-active substrate defining a plurality of alternating hole collecting zones and electron collecting zones arranged in parallel strips;
    b) depositing a conductive layer across said zones;
    c) depositing at least one conductive track extending along at least part of each of said zones;
    d) subsequently to step c), selectively forming a dielectric layer on each of said zones, so as to leave an exposed area free of dielectric at an interface between adjacent zones;
    e) etching said conductive layer in said exposed areas;
    f) applying a plurality of interconnecting conductors so as to electrically interconnect at least a portion of said hole collecting zones with each other, and to electrically interconnect at least a portion of said electron collecting zones with each other, wherein each of said tracks is continuous and wherein in step d) the dielectric layer is formed with greater thickness or width where electrical connections between said tracks and said interconnecting conductors are not desired, and lesser thickness or width where electrical connections between said tracks and said interconnecting conductors are desired.

14. Method of manufacturing a single-side-contacted photovoltaic device, comprising the steps of:
    a) providing a photovoltaically-active substrate defining a plurality of alternating hole collecting zones and electron collecting zones arranged in parallel strips;
    b) depositing a conductive layer across said zones;
    c) depositing at least one conductive track extending along at least part of each of said zones;
    d) subsequently to step c), selectively forming a dielectric layer on each of said zones, so as to leave an exposed area free of dielectric at an interface between adjacent zones;
    e) etching said conductive layer in said exposed areas;
    f) applying a plurality of interconnecting conductors so as to electrically interconnect at least a portion of said hole collecting zones with each other, and to electrically interconnect at least a portion of said electron collecting zones with each other, wherein said at least one conductive track is fully embedded in said selectively-formed dielectric layer or protrudes therefrom.

\* \* \* \* \*